(12) United States Patent
Kim et al.

(10) Patent No.: US 11,349,057 B2
(45) Date of Patent: May 31, 2022

(54) THERMOELECTRIC MODULE AND MANUFACTURING METHOD THEREOF

(71) Applicants: Hyundai Motor Company, Seoul (KR); Kia Motors Corporation, Seoul (KR); Industry-Academic Cooperation Foundation, Yonsei University, Seoul (KR)

(72) Inventors: Byung Wook Kim, Seongnam-si (KR); Jin Woo Kwak, Suwon-si (KR); Hoo Dam Lee, Seongnam-si (KR); Woo Ju Lee, Seoul (KR); Woo Chul Kim, Seoul (KR); Ji Yong Kim, Pocheon-si (KR); Dong Keon Lee, Changwon-si (KR)

(73) Assignees: Hyundai Motor Company, Seoul (KR); Kia Motors Corporation, Seoul (KR); Industry-Academic Cooperation Foundation, Seoul (KR)

( * ) Notice: Subject to any disclaimer, the term of this patent is extended or adjusted under 35 U.S.C. 154(b) by 367 days.

(21) Appl. No.: 16/680,884

(22) Filed: Nov. 12, 2019

(65) Prior Publication Data

US 2021/0005802 A1 Jan. 7, 2021

(30) Foreign Application Priority Data

Jul. 3, 2019 (KR) .......................... 10-2019-0080094

(51) Int. Cl.
*H01L 35/32* (2006.01)
*H01L 35/08* (2006.01)
*H01L 35/30* (2006.01)
*H01L 35/34* (2006.01)
*B62D 1/06* (2006.01)

(52) U.S. Cl.
CPC .............. *H01L 35/32* (2013.01); *H01L 35/08* (2013.01); *H01L 35/30* (2013.01); *H01L 35/34* (2013.01); *B62D 1/065* (2013.01)

(58) Field of Classification Search
None
See application file for complete search history.

(56) References Cited

U.S. PATENT DOCUMENTS

| 2012/0266930 A1* | 10/2012 | Toyoda | H01L 35/34 136/224 |
| 2013/0218241 A1* | 8/2013 | Savoy | A61F 7/007 438/54 |
| 2019/0148617 A1* | 5/2019 | Yi | H01L 35/32 136/205 |
| 2021/0100682 A1* | 4/2021 | Lakshmanan | H01L 35/32 |

FOREIGN PATENT DOCUMENTS

KR 20170125524 A 11/2017

* cited by examiner

*Primary Examiner* — Jayne L Mershon
(74) *Attorney, Agent, or Firm* — Slater Matsil, LLP

(57) ABSTRACT

A thermoelectric module includes an N-type thermoelectric material and a P-type thermoelectric material disposed so as to be spaced apart from the N-type thermoelectric material. A flexible electrode is electrically connected to the N-type thermoelectric material and the P-type thermoelectric material. The flexible electrode is configured to bend to match a curvature of an object, e.g., a steering wheel of a vehicle.

20 Claims, 15 Drawing Sheets

THERMOELECTRIC MODULE AND MANUFACTURING METHOD THEREOF

CROSS-REFERENCE TO RELATED APPLICATIONS

This application claims priority to Korean Patent Application No. 10-2019-0080094, filed in the Korean Intellectual Property Office on Jul. 3, 2019, which application is hereby incorporated herein by reference.

TECHNICAL FIELD

The present disclosure relates to a thermoelectric module and a manufacturing method thereof.

BACKGROUND

A thermoelectric device is a device that converts thermal energy into electrical energy, or vice versa. The thermoelectric device is referred to as a thermoelectric module, a Peltier module, or a thermoelectric cooler (TEC). The thermoelectric device is widely used as a cooling or heating device using the Peltier effect, in which, when current is supplied to opposite ends of a circuit composed of conductors different from each other, one side is heated, and the other side is cooled.

A steering wheel is a device that is generally mounted in a vehicle in order to allow a driver to drive the vehicle in a desired direction. The force of operating the steering wheel by the driver is transferred to driving wheels, which are provided with a suspension system, via a steering mechanism, which includes a steering column, a rack, and a pinion, in order to change the direction of the driving wheels, thereby changing the direction in which the vehicle travels according to the driver's intention.

In general, a steering wheel includes an annular-shaped rim, which a driver grips with the hands, a hub formed at the center portion thereof, to which a steering column is coupled, and a spoke, which is formed to have a predetermined size so as to contain an airbag and a horn therein.

In hot summer, a steering wheel for a vehicle is directly exposed to strong sunlight, and thus the surface temperature thereof increases to an extent to which it is difficult for a driver to grip the steering wheel with the hands. In cold winter, the surface temperature of the steering wheel decreases to an extent to which it is difficult for a driver to grip the steering wheel with the hands.

Therefore, in recent years, a temperature control device has been developed to directly cool or heat a steering wheel using a thermoelectric device, which is capable of performing heating and cooling operations, in order to increase the commercial value of a steering wheel compared to one having only basic functions.

However, a conventional bulk-type thermoelectric device is rigid and is difficult to bend, and thus it is difficult to mount on an object having a large curvature, such as the rim of a steering wheel. Further, there are limitations on securing a mounting position and a mounting area of the conventional bulk-type thermoelectric device. Furthermore, it is difficult to sufficiently secure an effective area for dissipating or absorbing heat.

Therefore, in recent years, various research has been made to enable free bending of a thermoelectric device to match the curvature of an object and to mount the thermoelectric device on a curved surface of the object while sufficiently securing effective cooling and heating areas of the thermoelectric device, but results thereof are insufficient, and thus there is a need for the development thereof.

SUMMARY

The present disclosure relates to a thermoelectric module and a manufacturing method thereof. Particular embodiments relate to a thermoelectric module capable of being easily mounted on a curved surface of an object and a manufacturing method thereof.

Embodiments of the present disclosure can help mitigate problems as discussed above. For example, embodiments of the present disclosure provide a thermoelectric module having improved freedom of installation and capable of being easily mounted on a curved surface of an object and a manufacturing method thereof.

Other embodiments provide a thermoelectric module having improved freedom of arrangement of N-type thermoelectric materials and P-type thermoelectric materials and being freely bendable to match a curved surface of an object and a manufacturing method thereof.

In accordance with an aspect of the present disclosure, the above and other objects can be accomplished by the provision of thermoelectric module including an N-type thermoelectric material, a P-type thermoelectric material disposed so as to be spaced apart from the N-type thermoelectric material, and a flexible electrode electrically connected to the N-type thermoelectric material and the P-type thermoelectric material and configured to bend to match the curvature of an object.

Thus, it is possible to simplify the structure of the thermoelectric module and to easily mount the thermoelectric module on a curved surface of the object.

A conventional bulk-type thermoelectric device is rigid and is difficult to bend, and thus it is difficult to mount on an object having a large curvature, such as the rim of a steering wheel. Further, there are limitations on securing a mounting position and a mounting area of the conventional bulk-type thermoelectric device. Furthermore, it is difficult to sufficiently secure an effective area for dissipating or absorbing heat.

However, according to the present disclosure, since the N-type thermoelectric material and the P-type thermoelectric material are connected to the flexible electrode, which is capable of bending to match the curvature of the object, the freedom of arrangement (the freedom of bending) of the N-type thermoelectric material and the P-type thermoelectric material is improved, and thus the thermoelectric module may be disposed so as to be rolled up to match the curvature of the object.

Thus, it is possible to easily mount the thermoelectric module on the object without limitation due to the curvature of the object and to sufficiently secure an effective area for dissipating or absorbing heat.

The N-type thermoelectric material and the P-type thermoelectric material may form a unit thermoelectric material. The unit thermoelectric material may be provided in a plurality thereof, and the plurality of unit thermoelectric materials may be spaced apart from each other along the curvature of the object.

The plurality of unit thermoelectric materials may be spaced apart from each other in the circumferential direction or the longitudinal direction of the object.

The flexible electrode may connect the unit thermoelectric materials in series. With the structure in which the unit thermoelectric materials constituting the thermoelectric module are connected in series, it is possible to secure sufficient resistance to suppress overcurrent, thereby maintaining an appropriate level of current with respect to the external voltage.

The flexible electrode may include a first flexible electrode electrically connected to one end of the N-type thermoelectric material and to one end of the P-type thermoelectric material, which form each of the unit thermoelectric materials, and a second flexible electrode electrically connected to an opposite end of the P-type thermoelectric material of one of the unit thermoelectric materials adjacent to each other and to an opposite end of the N-type thermoelectric material of the remaining one of the unit thermoelectric materials adjacent to each other.

The thermoelectric module may include a holder member supporting one of the unit thermoelectric materials adjacent to each other in the circumferential direction or the longitudinal direction of the object and the remaining one of the unit thermoelectric materials adjacent to each other.

The holder member may support the N-type thermoelectric material of one of the unit thermoelectric materials adjacent to each other and the P-type thermoelectric material of the remaining one of the unit thermoelectric materials adjacent to each other.

The holder member may include a first receiving hole in which the N-type thermoelectric material is received and a second receiving hole in which the P-type thermoelectric material is received.

The holder member may be provided in a plurality thereof, and the plurality of holder members may be disposed along the curvature of a steering wheel such that the long sides thereof are oriented in the circumferential direction of the steering wheel. As such, since the holder members are disposed along the curvature of the steering wheel such that the long sides thereof are oriented in the circumferential direction of the steering wheel, it is possible to place the holder members along the curvature of the steering wheel such that the holder members are in close contact with the outer surface of the steering wheel.

The thermoelectric module may include a support member, which connects the holder members disposed in the circumferential direction of the object and supports the arrangement of the holder members.

As such, since the holder members are supported by the support member, it is possible to stably support the arrangement of the holder members and to minimize separation of the holder members.

The support member may include a wire continuously wound on the holder members.

Each of the holder members may have a through-hole formed therein, and the wire may be wound on the holder members while passing through the through-hole. As such, since the wire is wound on the holder members while passing through the through-hole formed in each of the holder members, it is possible to more securely bind the holder members using the wire and to more effectively suppress separation of the holder members.

The N-type thermoelectric material and the P-type thermoelectric material may be brought into close contact with the object by tension applied to the wire. The wire may be optionally secured to the steering wheel.

In accordance with another aspect of the present disclosure, there is provided a method of manufacturing a thermoelectric module. The method includes preparing a thermoelectric module that includes an N-type thermoelectric material, a P-type thermoelectric material disposed so as to be spaced apart from the N-type thermoelectric material, and a flexible electrode electrically connected to the N-type thermoelectric material and the P-type thermoelectric material, and bending the thermoelectric module to match the curvature of an object.

The preparing the thermoelectric module may include forming a flexible electrode layer on the upper surface of a base plate, placing a thermoelectric material jig plate on the upper surface of the flexible electrode layer, mounting the N-type thermoelectric material and the P-type thermoelectric material in jig holes formed in the thermoelectric material jig plate, soldering the N-type thermoelectric material and the P-type thermoelectric material to the flexible electrode layer, removing the thermoelectric material jig plate, forming a first flexible electrode electrically connected to one end of the N-type thermoelectric material and to one end of the P-type thermoelectric material by cutting the flexible electrode layer, and forming a second flexible electrode electrically connected to the opposite end of the N-type thermoelectric material and to the opposite end of the P-type thermoelectric material. In the preparing the thermoelectric module, the thermoelectric module may be provided in a planar shape.

The method may include, after the forming the first flexible electrode, mounting a holder member to support the N-type thermoelectric material and the P-type thermoelectric material adjacent to each other. The second flexible electrode may be formed in the state in which the holder member is mounted.

In the mounting the holder member, the N-type thermoelectric material may be received in a first receiving hole formed in the holder member, and the P-type thermoelectric material may be received in a second receiving hole formed in the holder member.

The method may include winding a wire on the holder member constituting the thermoelectric module.

In the bending the thermoelectric module, the first flexible electrode and the second flexible electrode may be bent to match the curvature of the object.

In the bending the thermoelectric module, the first flexible electrode and the second flexible electrode may be bent to match the curvature of the object by pulling the holder member using the wire.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF ILLUSTRATIVE EMBODIMENTS

Figure 1:
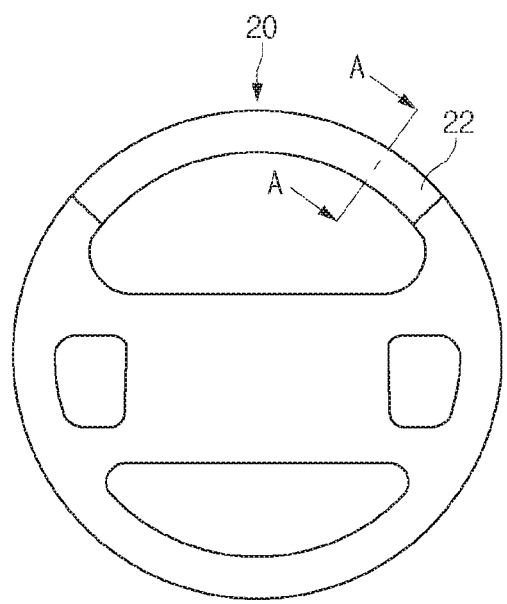
FIG. 1 is a view illustrating an object to which a thermoelectric module according to an embodiment of the present disclosure is applied.

Advantages and features of the present disclosure and methods for achieving them will become apparent from the descriptions of aspects herein below with reference to the accompanying drawings. However, the present disclosure is not limited to the aspects disclosed herein, but may be implemented in various different forms. The aspects are provided to make the description of the present disclosure thorough and to fully convey the scope of the present disclosure to those skilled in the art. It is to be noted that the scope of the present disclosure is defined only by the claims. Like reference numerals designate like elements throughout the specification. In relation to describing the present disclosure, when a detailed description of relevant known technology is determined to unnecessarily obscure the gist of the present disclosure, the detailed description may be omitted.

Figure 2:
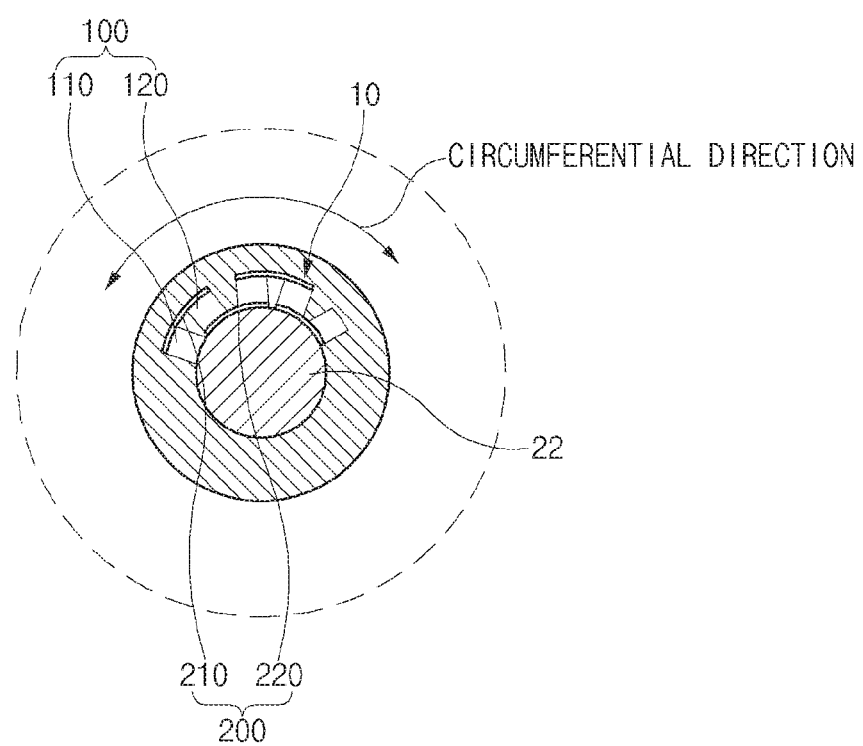
FIG. 2 is a cross-sectional view taken along line A-A in FIG. 1.
Figure 3:
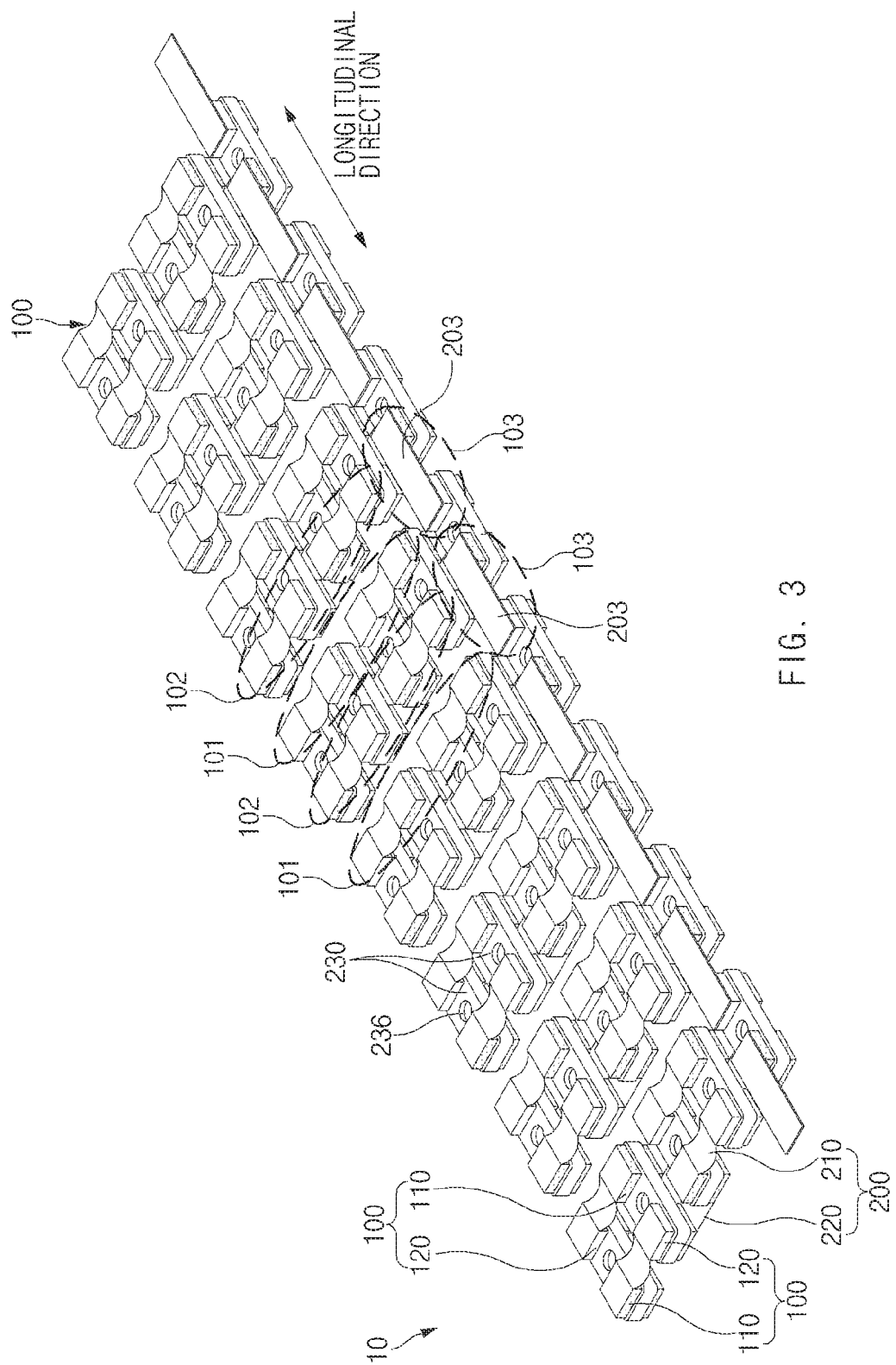
FIGS. 3 and 4 are views illustrating the thermoelectric module according to the embodiment of the present disclosure.
Figure 4:
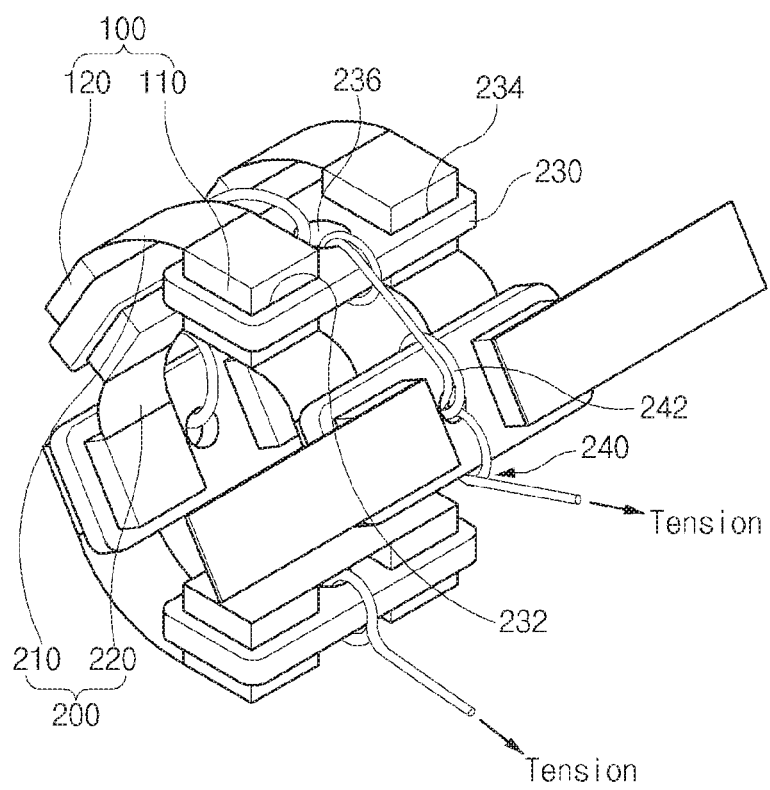
Figure 5:
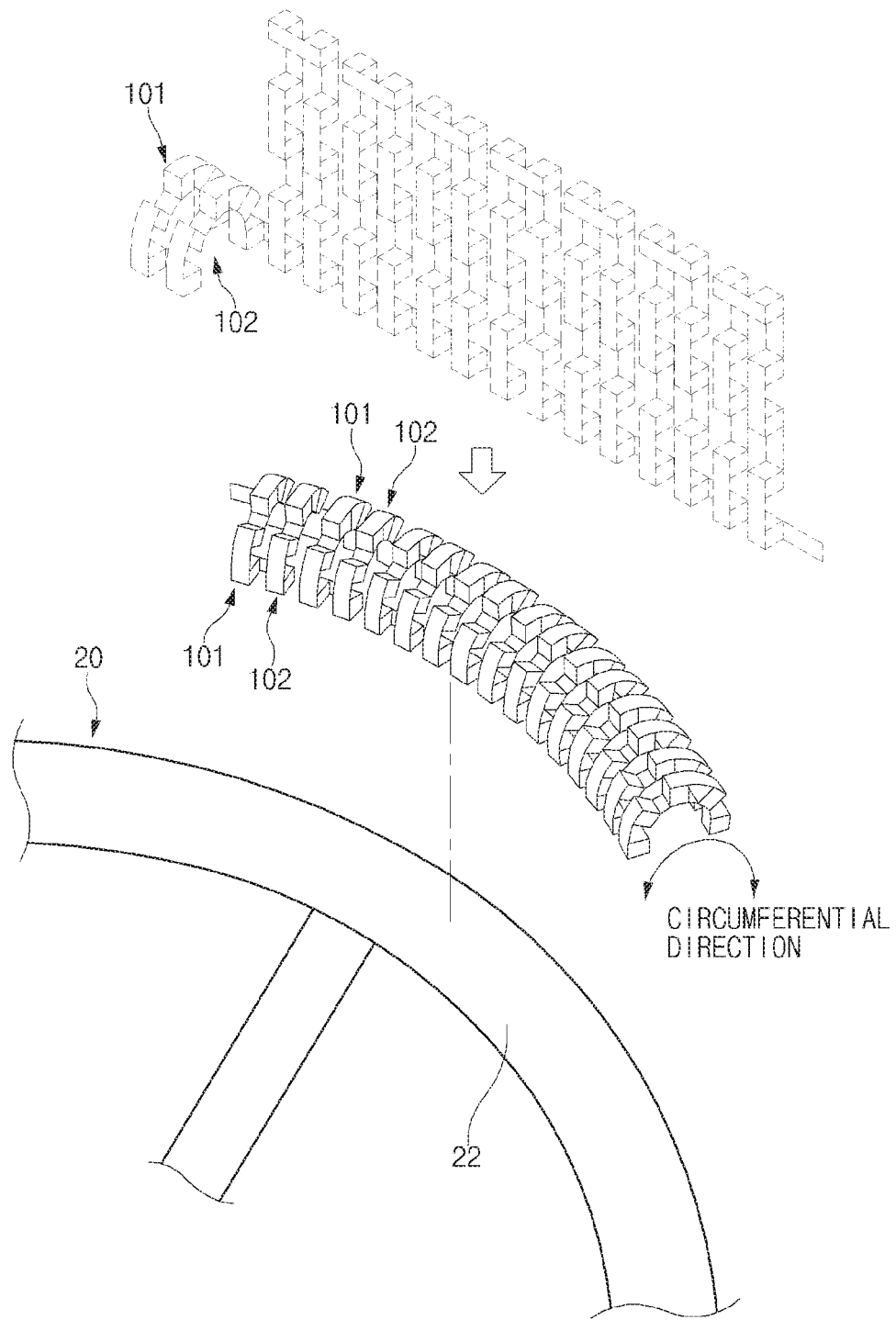
FIG. 5 is a view illustrating the arrangement structure of the thermoelectric module according to the embodiment of the present disclosure.

FIG. 1 is a view illustrating an object to which a thermoelectric module according to an embodiment of the present disclosure is applied, and FIG. 2 is a cross-sectional view taken along line A-A in FIG. 1. FIGS. 3 and 4 are views illustrating the thermoelectric module according to the embodiment of the present disclosure, and FIG. 5 is a view illustrating the arrangement structure of the thermoelectric module according to the embodiment of the present disclosure.

Referring to FIGS. 1 to 5, a thermoelectric module 10 according to an embodiment of the present disclosure includes N-type thermoelectric materials 110, P-type thermoelectric materials 120 disposed so as to be spaced apart from the N-type thermoelectric materials 110, and flexible electrodes 200 electrically connected to the N-type thermoelectric materials 110 and the P-type thermoelectric materials 120 and configured to bend to match the curvature of an object.

The thermoelectric module 10 according to the embodiment of the present disclosure may be mounted on an object having a curved outer surface. The present disclosure is not restricted or limited as to the type or structure of the object.

In one example, referring to FIG. 1, the thermoelectric module 10 according to the embodiment of the present disclosure is mounted on a rim 22 of a steering wheel 20.

Referring to FIGS. 2 to 5, the N-type thermoelectric materials 110 and the P-type thermoelectric materials 120 are disposed so as to form unit thermoelectric materials 100.

Each of the unit thermoelectric materials 100 includes a single N-type thermoelectric material 110 and a single P-type thermoelectric material 120, which have polarities opposite each other. The unit thermoelectric materials 100 may be disposed in any of various patterns depending on the required conditions and design specifications.

In one example, the unit thermoelectric materials 100 may be disposed so as to be spaced apart from each other along the curvature of an object (e.g. the rim of a steering wheel). The unit thermoelectric materials 100 may be disposed so as to be spaced apart from each other in the circumferential direction (or the longitudinal direction) of an object, or may be disposed in a zigzag pattern.

Specifically, the unit thermoelectric materials 100, which are disposed so as to be spaced apart from each other in the circumferential direction of the object 20, form a first unit thermoelectric material group 101. The unit thermoelectric materials 100, which are disposed so as to be spaced apart from the first unit thermoelectric material group 101 in the longitudinal direction of the object 20 and are disposed so as to be spaced apart from each other in the circumferential direction of the object 20, form a second unit thermoelectric material group 102. The N-type thermoelectric material 110, which is disposed at an end portion of any one of the first unit thermoelectric material group 101 and the second unit thermoelectric material group 102, and the P-type thermoelectric material 120, which is disposed at an end portion of the other one of the first unit thermoelectric material group 101 and the second unit thermoelectric material group 102, form an end unit thermoelectric material 103.

In this case, the first unit thermoelectric material group 101 and the second unit thermoelectric material group 102 may be provided in a plural number so as to be disposed alternately in the longitudinal direction of the object 20. The number of first unit thermoelectric material groups 101 and the number of second unit thermoelectric material groups 102 may be variously changed depending on the required conditions and design specifications.

The flexible electrodes 200 are electrically connected to the N-type thermoelectric materials 110 and the P-type thermoelectric materials 120, and are formed so as to bend to match the curvature of the steering wheel 20.

As such, since the N-type thermoelectric materials 110 and the P-type thermoelectric materials 120 are connected to the flexible electrodes 200, which are capable of bending to match the curvature of the object, the freedom of arrangement of the N-type thermoelectric materials 110 and the P-type thermoelectric materials 120 is improved, and thus the thermoelectric module 10 may be disposed so as to be rolled up to match the curvature of the object. As a result, it is possible to easily mount the thermoelectric module 10 on the object without limitation due to the curvature of the object and to sufficiently secure an effective area for dissipating or absorbing heat.

The flexible electrodes 200 are electrically connected to the unit thermoelectric materials 100, and power is applied to the flexible electrodes 200 from a power supply unit (not shown).

Here, the application of power to the flexible electrodes 200 is defined as including both the application of forward current to the flexible electrodes 200 and the application of reverse current to the flexible electrodes 200. For example, when forward current is applied to the flexible electrodes 200, the unit thermoelectric materials 100 may be heated. In contrast, when reverse current is applied to the flexible electrodes 200, the unit thermoelectric materials 100 may be cooled.

The flexible electrodes 200 may be electrically connected to the unit thermoelectric materials 100, and may be generally formed of a metal material (e.g. a copper foil) that is capable of flexibly bending. However, the present disclosure is not restricted or limited as to the material of the flexible electrodes 200.

The flexible electrodes 200 connect the unit thermoelectric materials 100, which constitute the thermoelectric module 10, to the power supply unit in series.

Specifically, the flexible electrodes 200 include first flexible electrodes 210, each of which is electrically connected to one end of the N-type thermoelectric material 110 and one end of the P-type thermoelectric material 120, which constitute each of the unit thermoelectric materials 100, and second flexible electrodes 220, each of which is electrically connected to an opposite end of the P-type thermoelectric material 120 of one of two adjacent unit thermoelectric materials 100 and an opposite end of the N-type thermoelectric material 110 of the other one of the two adjacent unit thermoelectric materials 100.

In one example, referring to FIG. 3, each of the first flexible electrodes 210 is electrically connected to the upper end of the N-type thermoelectric material 110 and the upper end of the P-type thermoelectric material 120, which constitute each of the unit thermoelectric materials 100, and each of the second flexible electrodes 220 is electrically connected to the lower end of the P-type thermoelectric material 120 of one of two adjacent unit thermoelectric materials 100 and the lower end of the N-type thermoelectric material 110 of the other one of the two adjacent unit thermoelectric materials 100.

In addition, the flexible electrodes 200 include third flexible electrodes 203, each of which is electrically connected to the N-type thermoelectric material 110 and the P-type thermoelectric material 120, which constitute each of the end unit thermoelectric materials 103. The first unit thermoelectric material groups 101 and the second unit thermoelectric material groups 102 are connected in series via the third flexible electrodes 203.

With the structure in which the unit thermoelectric materials 100 constituting the thermoelectric module 10 are connected to the power supply unit in series, it is possible for the thermoelectric module 10 to secure sufficient resistance, thereby preventing the application of overcurrent to the thermoelectric module 10.

In a structure (not shown) in which the unit thermoelectric materials 100 constituting the thermoelectric module 10 are connected to the power supply unit in parallel, each of the unit thermoelectric materials 100 has low resistance. Thus, even when the same external voltage is applied to the thermoelectric module 10, a relatively high current flows through each of the unit thermoelectric materials 100. On the other hand, when the unit thermoelectric materials 100 constituting the thermoelectric module 10 are connected to the power supply unit in series to form a unitary module, it is possible to secure sufficient resistance to suppress overcurrent, thereby maintaining an appropriate level of current with respect to the external voltage.

In addition, the thermoelectric module 10 may include holder members 230, each of which supports two adjacent ones of the unit thermoelectric materials 100.

In one example, each of the holder members 230 is provided so as to support one of two adjacent unit thermoelectric materials 100, which are disposed in the circumferential direction (or the longitudinal direction) of the steering wheel 20, and the other one of the two adjacent unit thermoelectric materials 100.

Specifically, each of the holder members 230 supports the N-type thermoelectric material 110 of one of two adjacent unit thermoelectric materials 100 and the P-type thermoelectric material 120 of the other one of the two adjacent unit thermoelectric materials 100.

In one example, each of the holder members 230 is formed in a rectangular block shape, and includes a first receiving hole 232, in which a corresponding one of the N-type thermoelectric materials 110 is received, and a second receiving hole 234, in which a corresponding one of the P-type thermoelectric materials 120 is received. The N-type thermoelectric material 110 may be received in the first receiving hole 232 such that the upper end portion and the lower end portion thereof are exposed outside, and the P-type thermoelectric material 120 may be received in the second receiving hole 234 such that the upper end portion and the lower end portion thereof are exposed outside.

As such, since the unit thermoelectric materials boo are supported by the holder members 230, it is possible to simultaneously adjust the positions of the respectively different unit thermoelectric materials 100, which are connected to the holder members 230, merely by adjusting the positions of the holder members 230. In addition, with the structure in which the holder members 230 support the unit thermoelectric materials 100, it is possible to stably maintain the arrangement of the unit thermoelectric materials 100 and to minimize damage to the unit thermoelectric materials 100 attributable to external impacts and interference.

The holder members 230 may be disposed along the curvature of the steering wheel 20 such that the long sides thereof are oriented in the circumferential direction of the steering wheel 20. As such, since the holder members 230 are disposed along the curvature of the steering wheel 20 such that the long sides thereof are oriented in the circumferential direction of the steering wheel 20, it is possible to place the holder members 230 along the curvature of the steering wheel 20 such that the holder members 230 are in close contact with the outer surface of the steering wheel 20.

In addition, the thermoelectric module 10 includes a support member 240, which connects the holder members 230 disposed in the circumferential direction of the object and supports the arrangement of the holder members 230.

As such, since the holder members 230 are supported by the support member 240, it is possible to stably support the arrangement of the holder members 230 and to minimize separation of the holder members 230.

The support member 240 may be formed in any of various structures capable of connecting the holder members 230. The present disclosure is not restricted or limited as to the structure or type of the support member 240.

In one example, the support member 240 includes a wire 242 that is continuously wound on the holder members 230.

Here, the continuous winding of the wire 242 on the holder members 230 means, for example, that the holder members 230 are bound by a single wire 242.

Each of the holder members 230 may have a through-hole 236 formed therein, through which the wire 242 passes so as to be wound on the holder members 230. As such, since the wire 242 is wound on the holder members 230 while passing through the through-hole 236 formed in each of the holder members 230, it is possible to more securely bind the holder members 230 using the wire 242 and to more effectively suppress separation of the holder members 230.

The N-type thermoelectric materials 110 and the P-type thermoelectric materials 120, which are supported by the holder members 230, may be brought into close contact with the object by tension applied to the wire 242, and the wire 242 may be optionally secured (e.g. tied) to the steering wheel 20.

Although it is described and illustrated by way of example in the embodiment of the present disclosure that the holder members 230 are secured to the steering wheel 20 using the wire 242, the present disclosure is not limited thereto. According to another embodiment of the present disclosure, the holder members (or the N-type thermoelectric materials and the P-type thermoelectric materials) may be secured to the steering wheel using a binding member, such as a cable tie, an adhesive member, or the like.

Hereinafter, a method of manufacturing a thermoelectric module according to an embodiment of the present disclosure will be described.

Figure 6:
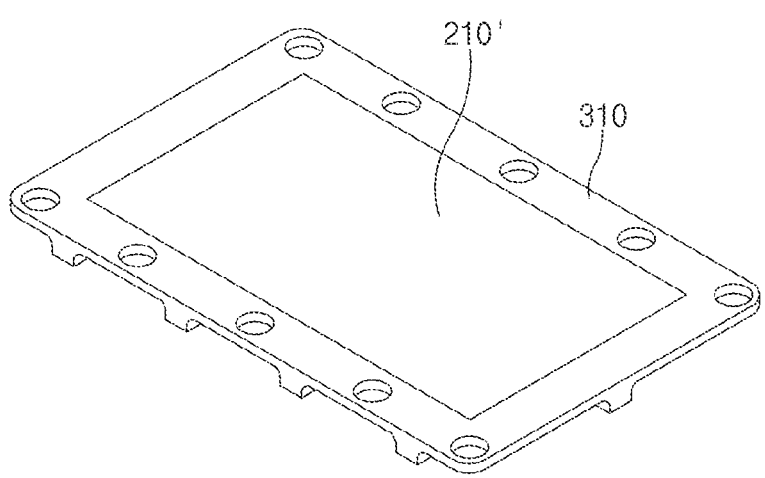
FIGS. 6 to 15 are views illustrating a method of manufacturing a thermoelectric module according to an embodiment of the present disclosure.
Figure 7:
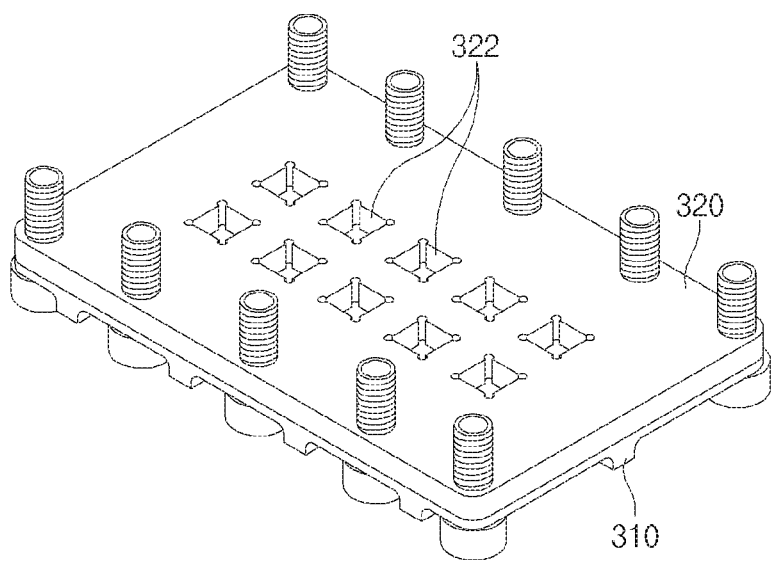
Figure 8:
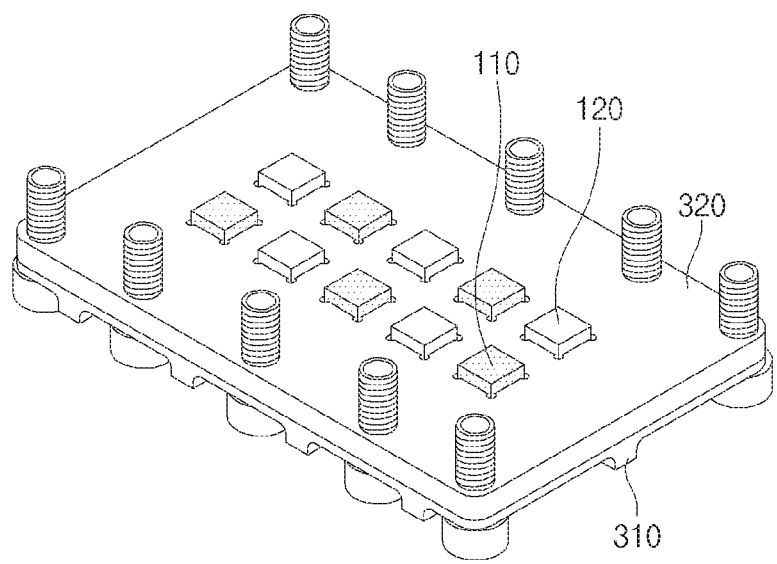
Figure 9:
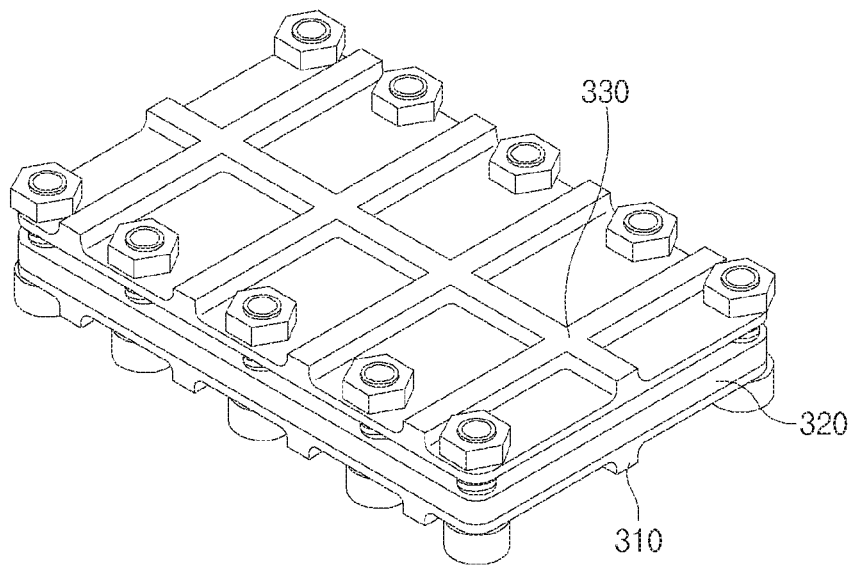
Figure 10:
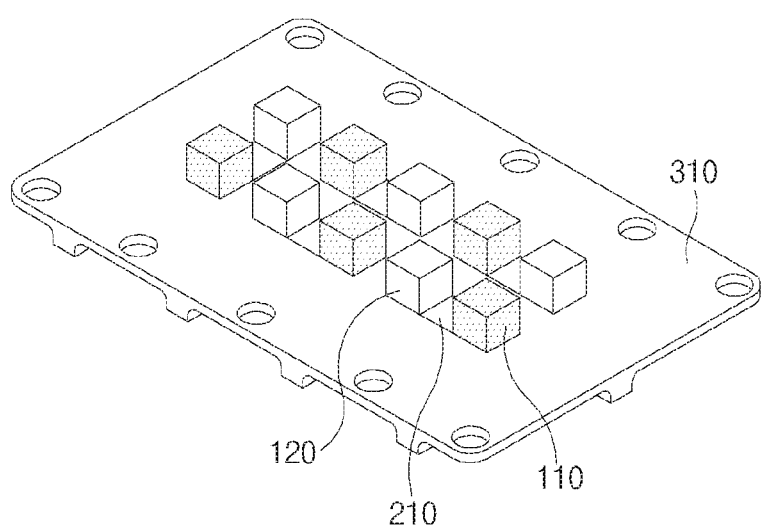
Figure 11:
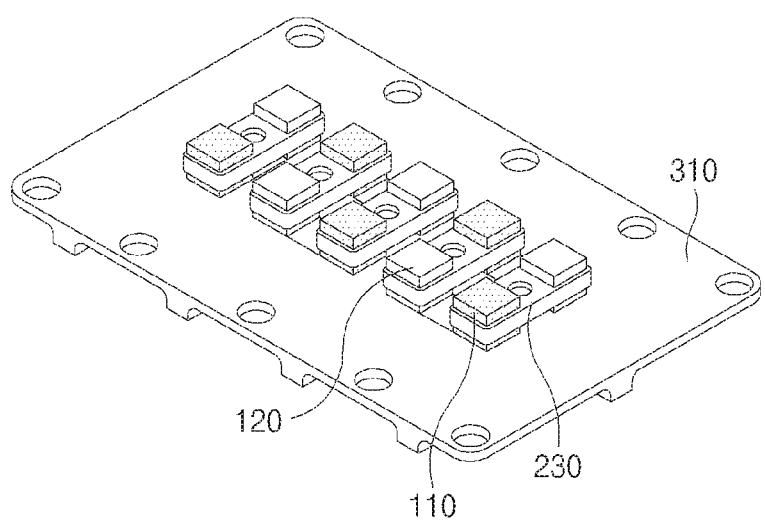
Figure 12:
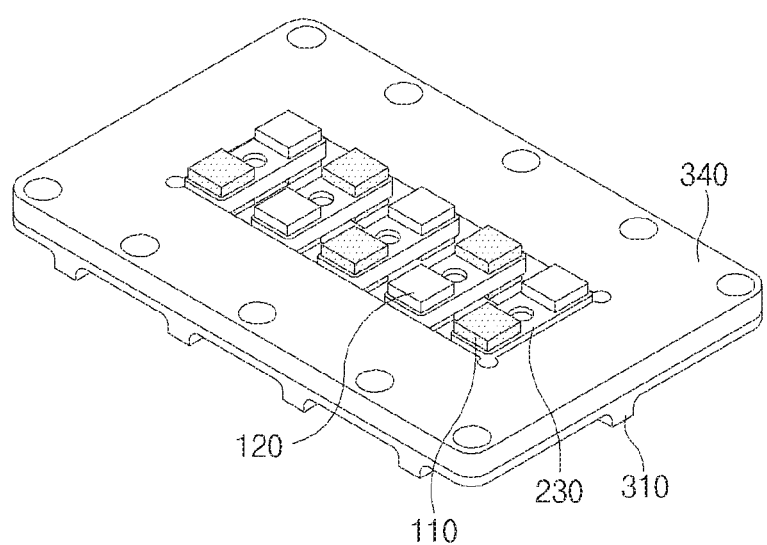
Figure 13:
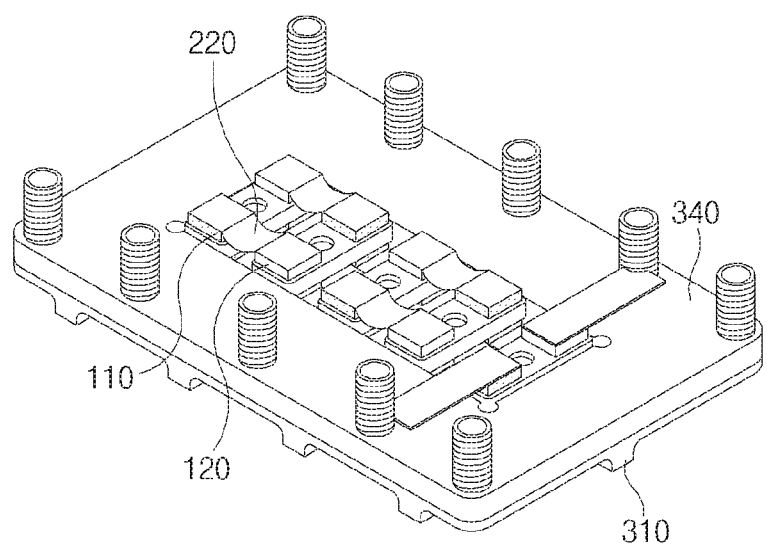
Figure 14:
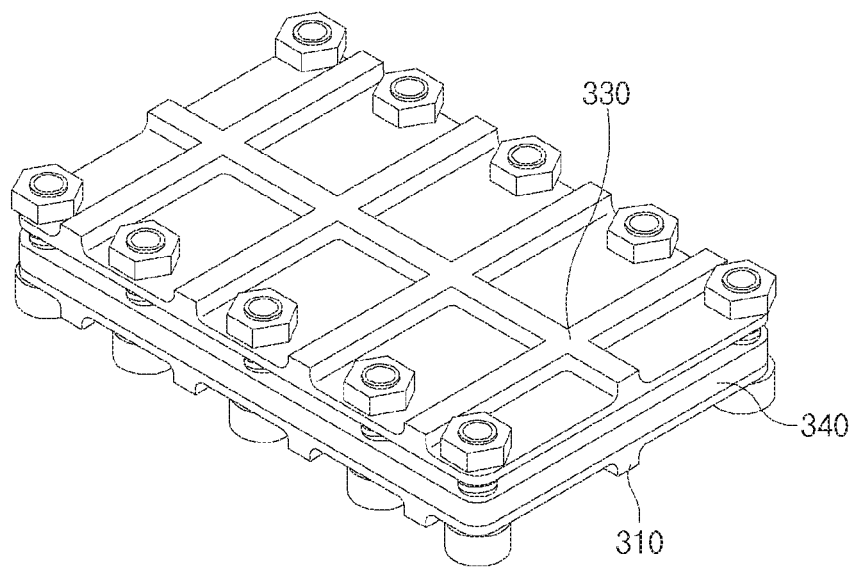
Figure 15:
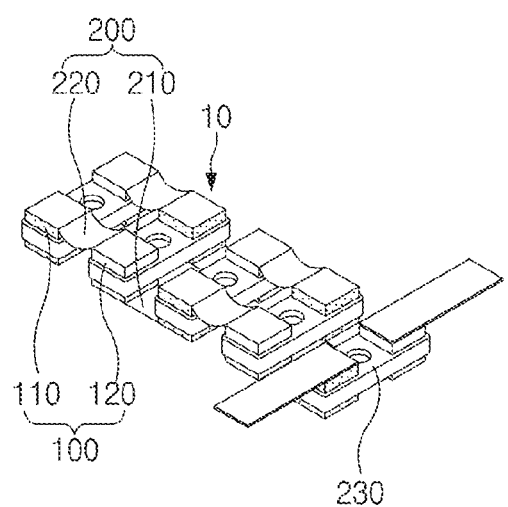

FIG. 6 is a view illustrating a step of forming an electrode layer in a thermoelectric-module-manufacturing method according to an embodiment of the present disclosure, FIG. 7 is a view illustrating a step of placing a jig plate in the thermoelectric-module-manufacturing method according to the embodiment of the present disclosure, and FIG. 8 is a view illustrating a step of mounting thermoelectric materials in the thermoelectric-module-manufacturing method according to the embodiment of the present disclosure. FIG. 9 is a view illustrating a step of soldering the thermoelectric materials in the thermoelectric-module-manufacturing method according to the embodiment of the present disclosure, FIG. 10 is a view illustrating a step of removing the jig plate in the thermoelectric-module-manufacturing method according to the embodiment of the present disclosure, and FIG. 11 is a view illustrating a step of forming first flexible electrodes in the thermoelectric-module-manufacturing method according to the embodiment of the present disclosure. FIG. 12 is a view illustrating a step of placing an assembly plate in the thermoelectric-module-manufacturing method according to the embodiment of the present disclosure, FIG. 13 is a view illustrating a step of forming second flexible electrodes in the thermoelectric-module-manufacturing method according to the embodiment of the present disclosure, FIG. 14 is a view illustrating a step of soldering the second flexible electrodes in the thermoelectric-module-manufacturing method according to the embodiment of the present disclosure, and FIG. 15 is a view illustrating the thermoelectric module manufactured through the thermoelectric-module-manufacturing method according to the embodiment of the present disclosure.

Parts that are the same as, or extremely similar to, those of the above description are denoted by the same reference numerals, and a detailed description thereof will be omitted.

Referring to FIGS. 6 to 15, a method of manufacturing a thermoelectric module according to an embodiment of the present disclosure includes a preparation step of preparing a thermoelectric module 10, which includes N-type thermoelectric materials 110, P-type thermoelectric materials 120 spaced apart from the N-type thermoelectric materials 110, and flexible electrodes 200 electrically connected to the N-type thermoelectric materials 110 and the P-type thermoelectric materials 120, and a bending step of bending the thermoelectric module 10 to match the curvature of an object.

In the preparation step, a thermoelectric module 10 including N-type thermoelectric materials 110, P-type thermoelectric materials 120, and flexible electrodes 200 is prepared.

Specifically, the preparation step includes a step of forming a flexible electrode layer 210' on the upper surface of a base plate 310, a step of placing a thermoelectric material jig plate 320 on the upper surface of the flexible electrode layer 210', a step of mounting the N-type thermoelectric materials 110 and the P-type thermoelectric materials 120 in jig holes 322 formed in the thermoelectric material jig plate 320, a step of soldering the N-type thermoelectric materials 110 and the P-type thermoelectric materials 120 to the flexible electrode layer 210', a step of removing the thermoelectric material jig plate 320, a step of forming first flexible electrodes 210, which are electrically connected to one ends of the N-type thermoelectric materials 110 and the P-type thermoelectric materials 120, by cutting the flexible electrode layer 210', and a step of forming second flexible electrodes 220, which are electrically connected to the opposite ends of the N-type thermoelectric materials 110 and the P-type thermoelectric materials 120. In the preparation step, the thermoelectric module 10 is provided in a planar shape.

Here, the provision of the thermoelectric module 10 in a planar shape means the provision of the thermoelectric module 10 in an unbent shape.

First, referring to FIG. 6, in the step of forming the electrode layer, the flexible electrode layer 210' is formed on the upper surface of the base plate 310.

The flexible electrode layer 210' may be generally formed of a metal material (e.g. a copper foil) that is capable of flexibly bending. The flexible electrode layer 210' is cut to form the first flexible electrodes 210 after the N-type thermoelectric materials 110 and the P-type thermoelectric materials 120 are soldered thereto.

Subsequently, referring to FIG. 7, the thermoelectric material jig plate 320 is disposed on the upper surface of the flexible electrode layer 210'.

The thermoelectric material jig plate 320 is provided to dispose the N-type thermoelectric materials 110 and the P-type thermoelectric materials 120 in a predetermined arrangement pattern.

Specifically, a plurality of jig holes 322 may be formed in the thermoelectric material jig plate 320, and the N-type thermoelectric materials 110 and the P-type thermoelectric materials 120 may be disposed over the jig holes 322.

Subsequently, referring to FIG. 8, the N-type thermoelectric materials 110 and the P-type thermoelectric materials 120 are mounted in the jig holes 322 formed in the thermoelectric material jig plate 320.

A solder paste is applied to the inside of each of the jig holes 322 (the upper surface of the flexible electrode layer 210') before the N-type thermoelectric materials 110 and the P-type thermoelectric materials 120 are mounted in the jig holes 322.

The solder paste is provided in the form of a mixture of solder powder and flux. However, the present disclosure is not restricted or limited as to the type or characteristics of the solder paste.

Subsequently, referring to FIG. 9, the N-type thermoelectric materials 110 and the P-type thermoelectric materials 120 are soldered to the flexible electrode layer 210'.

In the soldering step, a pressing plate 330 for pressing the N-type thermoelectric materials 110 and the P-type thermoelectric materials 120 may be used. The N-type thermoelectric materials 110 and the P-type thermoelectric materials 120 are soldered to the flexible electrode layer 210' by reflowing a solder paste in the state in which heat and pressure are applied to the N-type thermoelectric materials 110 and the P-type thermoelectric materials 120.

Subsequently, referring to FIG. 10, the pressing plate 330 and the thermoelectric material jig plate 320 are removed, and thereafter the flexible electrode layer 210' is cut to form the first flexible electrodes 210, which are electrically connected to one ends of the N-type thermoelectric materials 110 and the P-type thermoelectric materials 120.

In the step of forming the first flexible electrodes 210, the flexible electrode layer 210' is cut such that each of the first flexible electrodes 210 corresponds to a respective one of the unit thermoelectric materials 100.

As such, since the step of forming the first flexible electrodes 210 is performed such that the first flexible electrodes 210 are formed merely by cutting the flexible electrode layer 210', it is possible to simplify the process of forming the first flexible electrodes 210 and to shorten the time taken to form the first flexible electrodes 210.

Subsequently, referring to FIG. 11, after the first flexible electrodes 210 are formed, the holder members 230 may be mounted such that each of the holder members 230 supports a respective one of the N-type thermoelectric materials 110 and a respective one of the P-type thermoelectric materials 120, which are adjacent to each other.

Each of the holder members 230 is formed in a rectangular block shape, and includes a first receiving hole 232, in which a corresponding one of the N-type thermoelectric materials 110 is received, and a second receiving hole 234, in which a corresponding one of the P-type thermoelectric materials 120 is received.

In the step of mounting the holder members 230, each of the N-type thermoelectric materials 110 is received in the first receiving hole 232 formed in a corresponding one of the holder members 230, and each of the P-type thermoelectric materials 120 is received in the second receiving hole 234 formed in a corresponding one of the holder members 230. The N-type thermoelectric material 110 may be received in the first receiving hole 232 such that the upper end portion and the lower end portion thereof are exposed outside, and the P-type thermoelectric material 120 may be received in the second receiving hole 234 such that the upper end portion and the lower end portion thereof are exposed outside.

Subsequently, referring to FIG. 13, the second flexible electrodes 220 are formed so as to be electrically connected to the opposite ends of the N-type thermoelectric materials 110 and the P-type thermoelectric materials 120.

Before the second flexible electrodes 220 are formed, an assembly plate 340 may be stacked on the base plate 310. The second flexible electrodes 220 may be formed in the state in which the assembly plate 340 is stacked (refer to FIG. 12).

In one example, a solder paste (not shown) is applied to the opposite ends of the N-type thermoelectric materials 110 and the P-type thermoelectric materials 120, and thereafter the second flexible electrodes 220 are attached onto the solder paste.

Referring to FIG. 14, after the second flexible electrodes 220 are attached onto the solder paste, the second flexible electrodes 220 are soldered to the opposite ends of the N-type thermoelectric materials 110 and the P-type thermoelectric materials 120 by reflowing the solder paste in the state in which heat and pressure are applied to the N-type thermoelectric materials 110 and the P-type thermoelectric materials 120 using the pressing plate 330.

Subsequently, the pressing plate 330, the assembly plate 340, and the base plate 310 are removed, thereby completing the manufacture of the thermoelectric module 10 having a planar shape.

Referring to FIG. 15, the planar thermoelectric module 10 includes a plurality of N-type thermoelectric materials 110 and a plurality of P-type thermoelectric materials 120, which are electrically connected via the first flexible electrodes 210 and the second flexible electrodes 220.

Thereafter, the thermoelectric module 10 is bent to match the curvature of an object (e.g. a steering wheel).

In one example, in the bending step, the thermoelectric module 10 may be disposed so as to be rolled up in a manner such that the first flexible electrodes 210 and the second flexible electrodes 220 are bent to match the curvature of an object.

In addition, the method of manufacturing a thermoelectric module according to the embodiment of the present disclosure may further include a wire-winding step of winding a wire 242 on the holder members 230 of the thermoelectric module 10.

In one example, each of the holder members 230 may have a through-hole 236 formed therein, and the wire 242 may be wound on the holder members 230 while passing through the through-hole 236 (refer to FIG. 4).

In the bending step, the first flexible electrodes 210 and the second flexible electrodes 220 are bent by pulling the holder members 230 using the wire 242, with the result that the thermoelectric module is bent to match the curvature of an object.

As is apparent from the above description, according to the present disclosure, it is possible to improve freedom of installation of a thermoelectric module and thus to easily mount the thermoelectric module on a curved surface of an object.

In particular, according to the present disclosure, it is possible to improve freedom of arrangement of N-type thermoelectric materials and P-type thermoelectric materials and thus to enable the thermoelectric module to be freely bent along a curved surface of an object having a large curvature, such as a steering wheel.

In addition, according to the present disclosure, it is possible to easily mount the thermoelectric module on an object without limitation due to the curvature of the object and to maximize the effective area for dissipating or absorbing heat, thereby enhancing cooling/heating performance.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims.

What is claimed is:
1. A thermoelectric module, comprising:
an N-type thermoelectric material;
a P-type thermoelectric material disposed so as to be spaced apart from the N-type thermoelectric material; and
a flexible electrode electrically connected to the N-type thermoelectric material and the P-type thermoelectric material, the flexible electrode being configured to bend to match a curvature of an object;
wherein the N-type thermoelectric material and the P-type thermoelectric material are part of a unit thermoelectric material;
wherein the thermoelectric module comprises a plurality of unit thermoelectric materials, the plurality of unit thermoelectric materials being spaced apart from each other along the curvature of the object and being spaced apart from each other in a circumferential direction or a longitudinal direction of the object;
wherein the thermoelectric module further comprising a holder member supporting one of the unit thermoelectric materials adjacent to each other in the circumferential direction or the longitudinal direction of the object and a remaining one of the unit thermoelectric materials adjacent to each other;
wherein the holder member supports the N-type thermoelectric material of one of the unit thermoelectric materials adjacent to each other and the P-type thermoelectric material of a remaining one of the unit thermoelectric materials adjacent to each other;
wherein the holder member is disposed along the curvature of the object such that a long side thereof is oriented in the circumferential direction of the object;
wherein the holder member is one of a plurality of holder members, the plurality of holder members being disposed in the circumferential direction of the object;
wherein the thermoelectric module comprises a support member connecting the holder members and supporting arrangement of the holder members; and
wherein the support member is a wire continuously wound on the holder members.
2. The thermoelectric module according to claim 1, wherein the flexible electrode is electrically connected to one end of the N-type thermoelectric material and to one end of the P-type thermoelectric material, wherein each unit thermoelectric material comprises one of the N-type ther- moelectric materials, one of the P-type thermoelectric materials and one of the flexible electrodes; and wherein the thermoelectric module further comprises a second flexible electrode electrically connected to an opposite end of the P-type thermoelectric material of one of the unit thermoelectric materials adjacent to each other and to an opposite end of the N-type thermoelectric material of a remaining one of the unit thermoelectric materials adjacent to each other.

3. The thermoelectric module according to claim 2, comprising:

a first unit thermoelectric material group comprising a first plurality of unit thermoelectric materials disposed so as to be spaced apart from each other in the circumferential direction of the object;

a second unit thermoelectric material group comprising a second plurality of unit thermoelectric materials disposed so as to be spaced apart from the first unit thermoelectric material group in the longitudinal direction of the object and to be spaced apart from each other in the circumferential direction of the object; and an end unit thermoelectric material comprising the N-type thermoelectric material disposed at an end portion of one of the first unit thermoelectric material group and the second unit thermoelectric material group, and the P-type thermoelectric material disposed at an end portion of a remaining one of the first unit thermoelectric material group and the second unit thermoelectric material group.

4. The thermoelectric module according to claim 3, further comprising a third flexible electrode electrically connected to the N-type thermoelectric material and the P-type thermoelectric material, which form the end unit thermoelectric material.

5. The thermoelectric module according to claim 1, wherein the holder member comprises:

a first receiving hole in which the N-type thermoelectric material is received; and a second receiving hole in which the P-type thermoelectric material is received.

6. A method of making the thermoelectric module according to claim 1, the method comprising:

preparing the thermoelectric module to include the N-type thermoelectric material, the P-type thermoelectric material, and the flexible electrode; and bending the thermoelectric module to match the curvature of the object.

7. The method according to claim 6, wherein preparing the thermoelectric module comprises:

forming a flexible electrode layer on an upper surface of a base plate;

placing a thermoelectric material jig plate on an upper surface of the flexible electrode layer;

mounting the N-type thermoelectric material and the P-type thermoelectric material in jig holes formed in the thermoelectric material jig plate;

soldering the N-type thermoelectric material and the P-type thermoelectric material to the flexible electrode layer;

removing the thermoelectric material jig plate;

forming a first flexible electrode electrically connected to one end of the N-type thermoelectric material and to one end of the P-type thermoelectric material by cutting the flexible electrode layer; and forming a second flexible electrode electrically connected to an opposite end of the N-type thermoelectric material and to an opposite end of the P-type thermoelectric material, wherein the thermoelectric module is prepared in a planar shape.

8. The method according to claim 7, further comprising, after the forming the first flexible electrode, mounting a holder member to support the N-type thermoelectric material and the P-type thermoelectric material adjacent to each other, wherein the second flexible electrode is formed in a state in which the holder member is mounted.

9. The method according to claim 8, comprising winding a wire on the holder member.

10. The method according to claim 9, wherein bending the thermoelectric module comprises bending the first flexible electrode and the second flexible electrode to match the curvature of the object.

11. The method according to claim 10, wherein bending the thermoelectric module comprises bending the first flexible electrode and the second flexible electrode to match the curvature of the object by pulling the holder member using the wire.

12. A thermoelectric module, comprising:

an N-type thermoelectric material;

a P-type thermoelectric material disposed so as to be spaced apart from the N-type thermoelectric material; and a flexible electrode electrically connected to the N-type thermoelectric material and the P-type thermoelectric material, the flexible electrode being configured to bend to match a curvature of an object;

wherein the N-type thermoelectric material and the P-type thermoelectric material are part of a unit thermoelectric material;

wherein the thermoelectric module comprises a plurality of unit thermoelectric materials, the plurality of unit thermoelectric materials being spaced apart from each other along the curvature of the object and being spaced apart from each other in a circumferential direction or a longitudinal direction of the object;

wherein the thermoelectric module further comprising a holder member supporting one of the unit thermoelectric materials adjacent to each other in the circumferential direction or the longitudinal direction of the object and a remaining one of the unit thermoelectric materials adjacent to each other;

wherein the holder member supports the N-type thermoelectric material of one of the unit thermoelectric materials adjacent to each other and the P-type thermoelectric material of a remaining one of the unit thermoelectric materials adjacent to each other;

wherein the holder member is disposed along the curvature of the object such that a long side thereof is oriented in the circumferential direction of the object;

wherein the holder member is one of a plurality of holder members, the plurality of holder members being disposed in the circumferential direction of the object;

wherein the thermoelectric module comprises a support member connecting the holder members and supporting arrangement of the holder members;

wherein the support member is a wire continuously wound on the holder members;

wherein each of the holder members has a through-hole formed therein; and wherein the wire is wound on the holder members while passing through the through-hole.

13. The thermoelectric module according to claim 12, wherein the flexible electrode is electrically connected to one end of the N-type thermoelectric material and to one end of the P-type thermoelectric material, wherein each unit thermoelectric material comprises one of the N-type thermoelectric materials, one of the P-type thermoelectric materials and one of the flexible electrodes; and
   wherein the thermoelectric module further comprises a second flexible electrode electrically connected to an opposite end of the P-type thermoelectric material of one of the unit thermoelectric materials adjacent to each other and to an opposite end of the N-type thermoelectric material of a remaining one of the unit thermoelectric materials adjacent to each other.

14. The thermoelectric module according to claim 13, comprising:
   a first unit thermoelectric material group comprising a first plurality of unit thermoelectric materials disposed so as to be spaced apart from each other in the circumferential direction of the object;
   a second unit thermoelectric material group comprising a second plurality of unit thermoelectric materials disposed so as to be spaced apart from the first unit thermoelectric material group in the longitudinal direction of the object and to be spaced apart from each other in the circumferential direction of the object; and
   an end unit thermoelectric material comprising the N-type thermoelectric material disposed at an end portion of one of the first unit thermoelectric material group and the second unit thermoelectric material group, and the P-type thermoelectric material disposed at an end portion of a remaining one of the first unit thermoelectric material group and the second unit thermoelectric material group.

15. The thermoelectric module according to claim 14, further comprising a third flexible electrode electrically connected to the N-type thermoelectric material and the P-type thermoelectric material, which form the end unit thermoelectric material.

16. The thermoelectric module according to claim 12, wherein the holder member comprises:
   a first receiving hole in which the N-type thermoelectric material is received; and
   a second receiving hole in which the P-type thermoelectric material is received.

17. A thermoelectric module, comprising:
   an N-type thermoelectric material;
   a P-type thermoelectric material disposed so as to be spaced apart from the N-type thermoelectric material; and
   a flexible electrode electrically connected to the N-type thermoelectric material and the P-type thermoelectric material, the flexible electrode being configured to bend to match a curvature of an object;
   wherein the N-type thermoelectric material and the P-type thermoelectric material are part of a unit thermoelectric material;
   wherein the thermoelectric module comprises a plurality of unit thermoelectric materials, the plurality of unit thermoelectric materials being spaced apart from each other along the curvature of the object and being spaced apart from each other in a circumferential direction or a longitudinal direction of the object;
   wherein the thermoelectric module further comprising a holder member supporting one of the unit thermoelectric materials adjacent to each other in the circumferential direction or the longitudinal direction of the object and a remaining one of the unit thermoelectric materials adjacent to each other;
   wherein the holder member supports the N-type thermoelectric material of one of the unit thermoelectric materials adjacent to each other and the P-type thermoelectric material of a remaining one of the unit thermoelectric materials adjacent to each other;
   wherein the holder member is disposed along the curvature of the object such that a long side thereof is oriented in the circumferential direction of the object;
   wherein the holder member is one of a plurality of holder members, the plurality of holder members being disposed in the circumferential direction of the object;
   wherein the thermoelectric module comprises a support member connecting the holder members and supporting arrangement of the holder members;
   wherein the support member is a wire continuously wound on the holder members; and
   wherein the N-type thermoelectric material and the P-type thermoelectric material are brought into close contact with the object by tension applied to the wire.

18. The thermoelectric module according to claim 17, wherein the flexible electrode is electrically connected to one end of the N-type thermoelectric material and to one end of the P-type thermoelectric material, wherein each unit thermoelectric material comprises one of the N-type thermoelectric materials, one of the P-type thermoelectric materials and one of the flexible electrodes; and
   wherein the thermoelectric module further comprises a second flexible electrode electrically connected to an opposite end of the P-type thermoelectric material of one of the unit thermoelectric materials adjacent to each other and to an opposite end of the N-type thermoelectric material of a remaining one of the unit thermoelectric materials adjacent to each other.

19. The thermoelectric module according to claim 18, comprising:
   a first unit thermoelectric material group comprising a first plurality of unit thermoelectric materials disposed so as to be spaced apart from each other in the circumferential direction of the object;
   a second unit thermoelectric material group comprising a second plurality of unit thermoelectric materials disposed so as to be spaced apart from the first unit thermoelectric material group in the longitudinal direction of the object and to be spaced apart from each other in the circumferential direction of the object; and
   an end unit thermoelectric material comprising the N-type thermoelectric material disposed at an end portion of one of the first unit thermoelectric material group and the second unit thermoelectric material group, and the P-type thermoelectric material disposed at an end portion of a remaining one of the first unit thermoelectric material group and the second unit thermoelectric material group.

20. The thermoelectric module according to claim 17, wherein the holder member comprises:
   a first receiving hole in which the N-type thermoelectric material is received; and
   a second receiving hole in which the P-type thermoelectric material is received.

* * * * *